United States Patent [19]

Teherani et al.

[11] Patent Number: 4,726,885
[45] Date of Patent: Feb. 23, 1988

[54] SELENIDIZATION PASSIVATION

[75] Inventors: Towfik H. Teherani, Plano; D. Dawn Little, Euless, both of Tex.

[73] Assignee: Texas Instruments Incorporated, Dallas, Tex.

[21] Appl. No.: 827,315

[22] Filed: Feb. 7, 1986

[51] Int. Cl.⁴ .......................... C25D 9/06; B32B 9/00
[52] U.S. Cl. ................... 204/34.5; 204/56.1; 357/52; 357/61
[58] Field of Search .......... 204/34.5, 56 R, 59 R, 204/86, 128; 250/338 SE, 370 JX; 357/52, 61; 427/87

[56] References Cited

U.S. PATENT DOCUMENTS

| | | | |
|---|---|---|---|
| 3,799,803 | 3/1974 | Kraus et al. ............... | 357/61 X |
| 3,977,018 | 8/1976 | Catagnus et al. ........... | 357/30 |
| 4,132,999 | 1/1979 | Maillé et al. .............. | 357/30 |
| 4,137,544 | 1/1979 | Koehler .................... | 357/30 |
| 4,447,291 | 5/1984 | Schulte .................... | 156/643 |
| 4,452,675 | 6/1984 | Cipris et al. .............. | 204/56 R |
| 4,465,565 | 8/1984 | Zanio ...................... | 204/56 R |
| 4,536,260 | 8/1985 | Cocivera ................... | 204/37.1 |
| 4,632,886 | 12/1986 | Teherani et al. ........... | 428/698 |

*Primary Examiner*—John F. Niebling
*Assistant Examiner*—William T. Leader
*Attorney, Agent, or Firm*—Leo N. Heiting; Carlton H. Hoel; Mel Sharp

[57] ABSTRACT

A method of passivation of $HG_{1-x}Cd_xTe$ by anodic selenidization is disclosed; in preferred embodiments the selenidization is by anodic growing of the selenides in an electrolyte solution of sodium selenide in water and ethylene glycol or in a solution of sodium selenide plus sodium hydroxide in water and ethylene glycol. Also, infrared detectors incorporating such selenide passivated $Hg_{1-x}Cd_xTe$ are disclosed.

11 Claims, 4 Drawing Figures

SELENIDIZATION PASSIVATION

BACKGROUND OF THE INVENTION

The present invention relates to semiconductor materials, and, more particularly, to the passivation of mercury cadmium telluride ($Hg_{1-x}Cd_xTe$) and related materials by anodic selenidization.

Alloys of mercury telluride and cadmium telluride, generically denoted $Hg_{1-x}Cd_xTe$, are extensively employed as photosensitive semiconductors for infrared radiation detection. For example, $Hg_{0.8}Cd_{0.2}Te$ has a bandgap of about 0.1 eV which corresponds to a photon wavelength of 12 $\mu$m and $Hg_{0.73}Cd_{0.27}Te$ a bandgap of about 0.24 eV corresponding to a photon wavelength of 5 $\mu$m. These two wavelengths are in the two atmospheric windows of greatest interest for infrared detectors. In particular, p-n junction $Hg_{1-x}Cd_xTe$ photodiode arrays have long been used (see, for example, Lorenze, U.S. Pat. No. 4,286,278), and extrinisic p type $Hg_{1-x}Cd_xTe$ has potential application in infrared focal plane MIS detector arrays operating in the 10–12 $\mu$m wavelength window. (Note that intrinsic p type $Hg_{1-x}Cd_xTe$, whose doping is presumably dominated by mercury vacancies, was recently found to have midgap recombination centers proportional in concentration to the shallow acceptors; see C.Jones et al, 3 J.Vac.Sci.Tech.A 131 (1985). These recombination centers shorten minority carrier lifetimes and are sources of recombination-generation noise; thus extrinsic p type $Hg_{1-x}Cd_xTe$ is preferred to intrinsic p type.) Such detectors are fabricated in large area $Hg_{1-x}Cd_xTe$ that may be grown by LPE, MOCVD, MBE or bulk techniques and are operated typically at liquid nitrogen temperatures.

Passivation of $Hg_{1-x}Cd_xTe$ prior to detector fabrication is necessary to avoid surface contamination by residues of various processing steps. Such contamination affects the electrical characteristics of the detectors, for example, the photocarrier lifetime and stability. Analogous passivation of silicon for integrated circuits fabrication is typically achieved by growth of thermal oxides at temperatures about 1,000° C.; however, thermal growth of oxides on $Hg_{1-x}Cd_xTe$ is not feasible due to the out diffusion of mercury at even moderate temperatures. Consequently, passivation of $Hg_{1-x}Cd_xTe$ by deposition of zinc sulfide or silicon dioxide has been used, but such passivation yields detectors that degrade (surface state density and accumulated surface charge vary and give unstable device characteristics) when subjected to temperatures over 70° C. An improvement is passivation by anodic oxide, wherein oxides of mercury, cadmium, and tellurium are grown on the surface of $Hg_{1-x}Cd_xTe$ electrochemically in a KOH solution; see Catagnus, U.S. Pat. No. 3,977,018. Anodic oxide is also temperature sensitive and yeilds detectors that degrade at about 80° C. Further, even extended storage at room temperature degrades such detectors. Thus it is a problem to provide a passivation for $Hg_{1-x}Cd_xTe$ that avoids detector degradation at temperatures somewhat above room temperature.

SUMMARY OF THE INVENTION

The present invention provides passivation methods and passivation layers for $Hg_{1-x}Cd_xTe$ by anodic selenidization of the surface of $Hg_{1-x}Cd_xTe$ in an electrolyte containing selenide ions. The passivation layer is primarily cadmium selenide with some mercury selenide and leads to infrared detectors that resist degradation at temperatures of 120° C. Such passivation layer is compatible with standard $Hg_{1-x}Cd_xTe$ processing and solves the problems of known passivation layers.

DESCRIPTION OF THE PREFERRED EMBODIMENTS

Figure 1A:
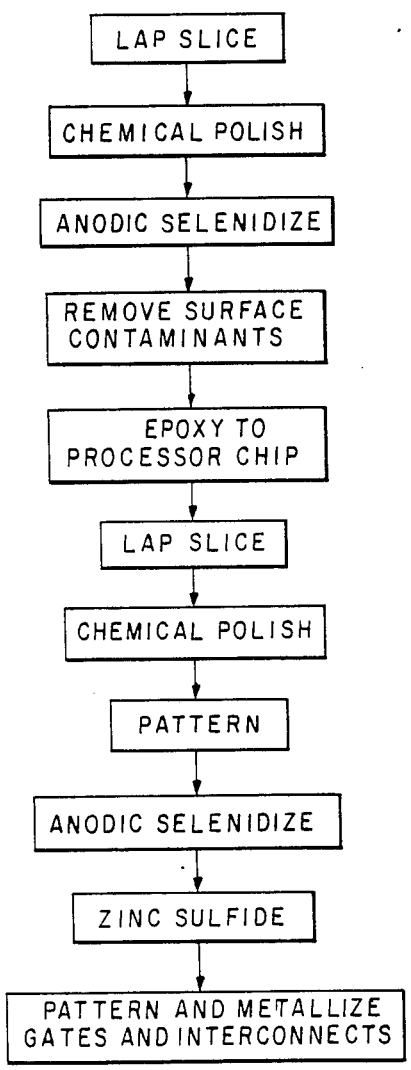
FIG. 1A is are a flow chart for a fabrication process for an array of $Hg_{1-x}Cd_xTe$ photodetectors.
Figure 1B:
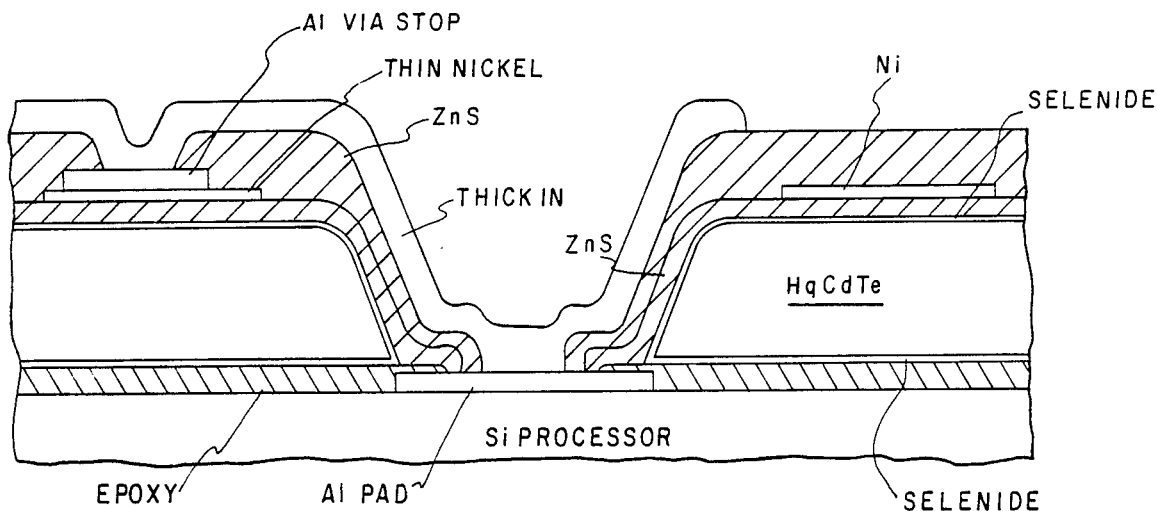
FIG. 1B is a partial cross sectional view of a single photodetector in such an array.

FIG. 1A is a flow chart incorporating preferred embodiment selenidization in the fabrication of a hybrid array of $Hg_{1-x}Cd_xTe$ MIS photodetectors, and FIG. 1B illustrates a single detector of such an array in partial cross sectional view. The fabrication includes the following steps. First, a single crystal n type $Hg_{1-x}Cd_xTe$ slice (typically 20 mm by 5 mm by 0.5 mm) is waxed to a lapping plug on one of its 20 mm by 5 mm surfaces and is lapped (with, for example, a paste of five micron alumina particles followed by three micron particles) to remove any damage to the other 20 mm by 5 mm surface resulting from the sawing of an ingot of $Hg_{1-x}Cd_xTe$ into slices. Next, the lapped surface of the slice is chemically polished with a 0.5% solution of bromine in methanol to remove any damage arising from the mechanical lapping. After cleaning, the polished surface is anodically selenidized to yield a passivating selenide thickness of about 200 Å; and surface contaminants are removed. Then the $Hg_{1-x}Cd_xTe$ slice is epoxied to a silicon processor chip with the passivated surface making the contact (see the lower layer of selenide in FIG. 1B). The silicon chip is now waxed to a lapping plug and the exposed 20 mm by 5 mm surface of the $Hg_{1-x}Cd_xTe$ slice is lapped down until the $Hg_{1-x}Cd_xTe$ slice is about 75 microns thick; this is followed by chemical polishing down to a thickness of about 12 microns. Now the $Hg_{1-x}Cd_xTe$ is patterned and etched with bromine-methanol to form an array of $Hg_{1-x}Cd_xTe$ detector areas; further processing (such as ion milling) opens vias for each of the detector areas to connect with an adjacent aluminum contact pad on the silicon processor chip. Next, the $Hg_{1-x}Cd_xTe$ is again anodically selenidized to a selenide thickness of 200 Å, and this is followed by deposition of 2,500 Å of zinc sulfide; the two layer insulator (selenide plus zinc sulfide) forms the MIS gate insulator. Patterning and etching to define the gates comes next, and is followed by gate metallization, further zinc sulfide, and interconnections to complete the array. See, generally for the anodic oxide version of the process, Schulte, U.S. Pat. No. 4,447,291, which is hereby incorporated by reference as are all other cited references.

Other types of infrared detectors and arrays of detectors incorporate $Hg_{1-x}Cd_xTe$ with passivation layers of various kinds, these detectors and arrays may similarly be fabricated with substitution of their oxide passivation steps by anodic selenidization.

Figure 2:
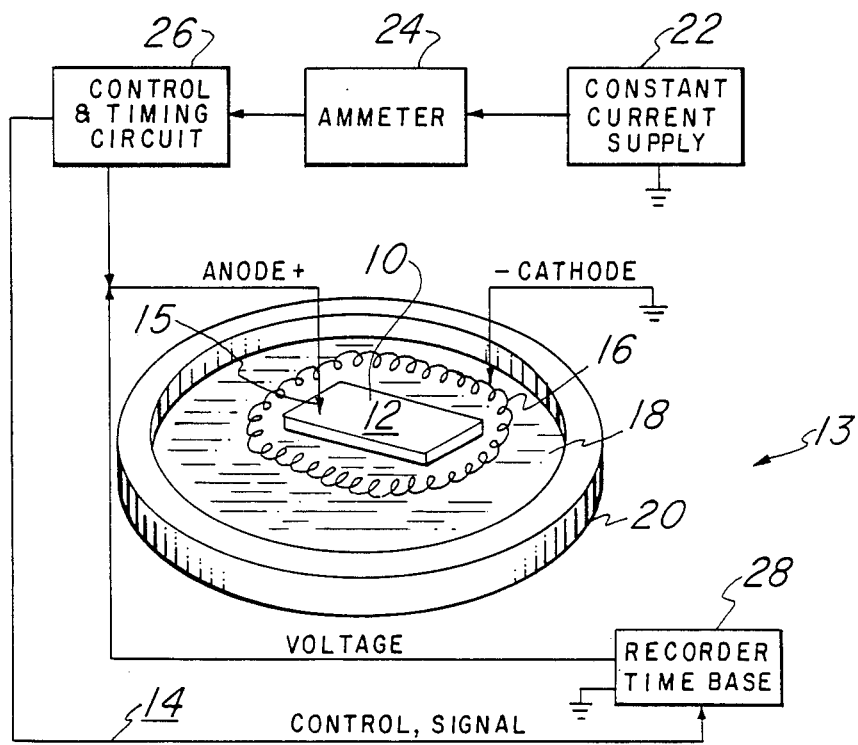
FIG. 2 is a schematic block diagram for an anodization apparatus.

FIG. 2 schematically illustrates anodizing apparatus 13 which may be used for the selenidization passivation steps of the flow of FIG. 1A, and emplys a two electrode Teflon cell. $Hg_{1-x}Cd_xTe$ slice 10 is placed horizontally in the cell with cleaned surface 12 of slice 10 made the anode via contact with an etched platinum or iridium probe 15 (the edges of slice 10 are only a small portion of the area in contact with the electrolyte) The cathode is circular platinum electrode 16. Electrolyte 18 may be one of several solutions: for example, 0.06M $Na_2Se$ in 20% water and 80% ethylene glycol, or 0.1M $Na_2Se$ and 0.1M NaOH in 20% water/80% ethylene glycol. The effects of these electrolytes on the anodic selenide layer characteristics will be discussed in the following. Electrolyte 18 is contained in a suitable tank 20 which may be Teflon or polypropylene; and due to the instability of the $Se^=$ ion, the 20% water and 80% glycol solution is first purged of oxygen with nitrogen prior to dissolving the sodium selenide, and a nitrogen atmosphere over electrolyte 18 is maintained to preclude oxygen.

Apparatus 13 has a constant current supply source 22 for supplying a constant current of about 100 μA (current density of about 100 $\mu A/cm^2$ for a 20 mm by 5 mm slice) through an ammeter 24 to a control and timing circuit 26. Timing and control circuit 26 has one output connected to the anode and another output connected to a recorder 28 which records the voltage and anodization formation time. Timing and control circuit 26 automatically adjusts the voltage of the system to maintain the current constant during anodization of surface 12. Note that the selenide layer is conductive. Electrolyte 18 is stirred during the anodization and is maintained at about room temperature.

A constant current applied for a definite time produces an anodized selenide layer on $Hg_{1-x}Cd_xTe$ having reproducible uniform properties; the electrolyte selected determines the thickness and quality of the anodized layer. $Hg_{0.8}Cd_{0.2}Te$ anodized with 0.06M $Na_2Se$ in 20% water and 80% ethylene glycol at a current density of 100 $\text{Å}A/cm^2$ for 15 minutes yields a 50 Å thick selenide layer which appears to be mainly CdSe with some HgSe as evidenced from surface analysis; whereas, use of 0.1M $Na_2Se$ and 0.1M NaOH in 20% water/80% ethylene glycol as the electrolyte under similar conditions yields a 100 Å thick selenide layer.

Figure 3:
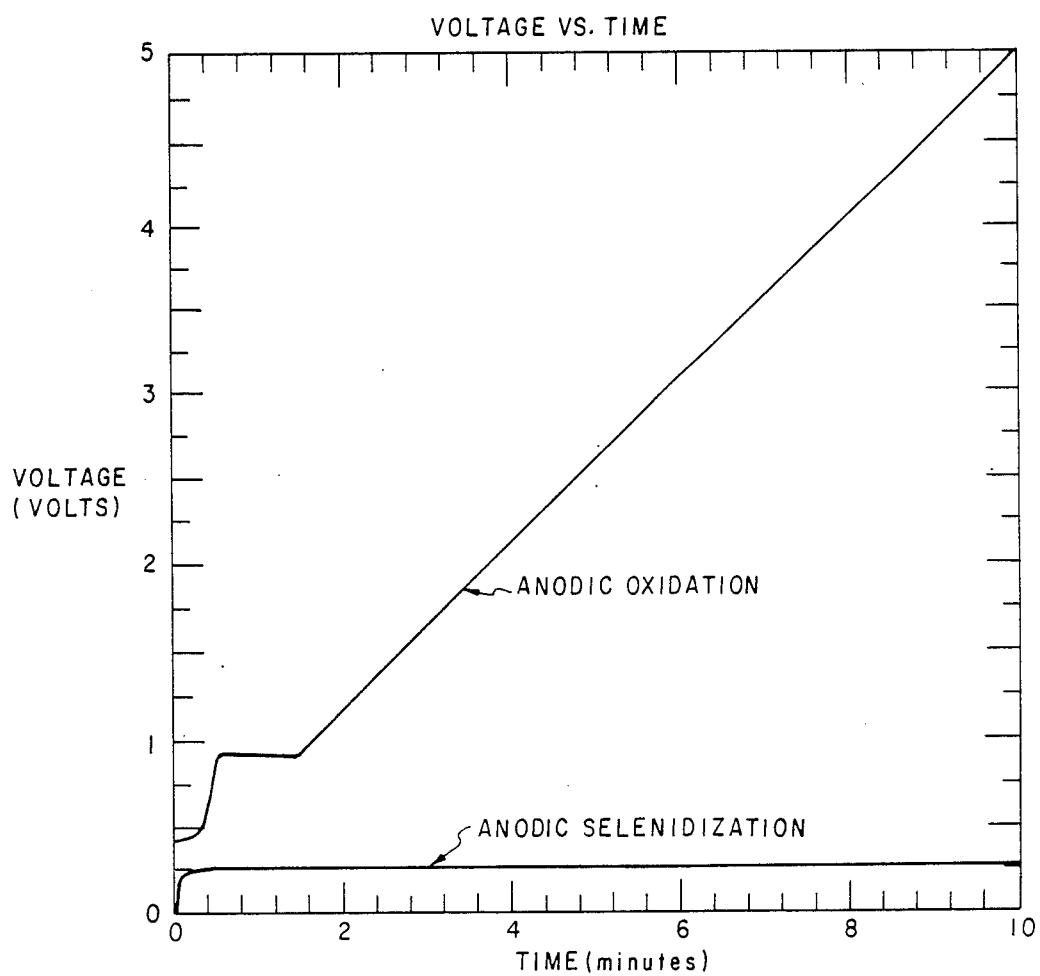
FIG. 3 shows the dependence of applied voltage on selenide layer thickness for constant current anodization and the corresponding dependence for oxide anodization.

FIG. 3 illustrates the voltage drop dependence on layer thickness for $Hg_{.7}Cd_{.3}Te$ anodized with 0.06M $Na_2Se$ in 20% water and 80% ethylene glycol at a current density of 100 $\mu A/cm^2$ and also the corresponding voltage drop dependence on layer thickness for anodic oxidation for comparison. The selenide layer is conductive, so the voltage remains essentially constant; in contrast, the oxide layer impedance is roughly proportional to the oxide layer thickness.

An increase in temperature and concentration of the selenide ions in solution increases the selenidization rate. Beyond 0.1M $Se^=$, however, no effect of concentration is observed. Organic solvents such as ethylene glycol decrease the growth rate by promoting ion pairing and decreasing the free $Se^=$. On the other hand, the addition of bases such as NaOH and KOH increases the selenidization rate by increasing the hydrolysis of the $Se^=$. Applying constant voltage instead of constant current for the anodization results in larger intial currents and poor layer quality; the layer uniformity appears to be closely related to current density uniformity.

MODIFICATIONS AND ADVANTAGES

Various modifications of the preferred embodiment passivation methods and devices may be made while retaining the feature of selenidizing $Hg_{1-x}Cd_xTe$ electrochemically to form a passivating layer of primarily cadmium selenide with some mercury selenide. For example, various size slices and ingots of $Hg_{1-x}Cd_xTe$ can be anodized in various solutions with available selenide ions, such as potassium selenide and potassium hydroxide dissolved in water. (Note that Pat. No. 4,632,886 of Teherani and Simmons which is assigned to the assignee of the present aplication, discloses an anodic sulfidization passivation for $Hg_{1-x}Cd_xTe$). The current density may be varied depending upon the electrolyte solution used: $Hg_{0.7}Cd_{0.3}Te$ anodized with 0.06M $Na_2Se$ in 20% water and 80% ethylene glycol at a current density much greater than about 200 $\mu A/cm^2$ yields a dark selenide layer with a matte finish due to the oxidation of $Se^=$ to Se, but with lower current densities the layer is uniform with a shiny appearance and characteristic colors. Thus thick layers with high quality require long anodization times and low current densities; times of twenty to forty minutes can yield selenide layers of thicknesses in the range of 150 to 300 Å.

Further, the method could also be applied to thin films of $Hg_{1-x}Cd_xTe$ such as LPE or VPE films on various substrates such as CdTe and CdMnTe, as well as other compound semiconductors. Such substrates with doped films and doped bulk $Hg_{1-x}Cd_xTe$ can be incorporated into various infrared detectors and arrays to provide the photosensitive semiconductor. Detectors employing photodiodes, CCDs, CIDs, as well as the CIM of FIG. 1B all can use the selenide passivation.

The advantages of selenidization passivation include $Hg_{1-x}Cd_xTe$ devices with stability at higher temperatures than corresponding passivation with oxide or sulfide.

What is claimed is:

1. A method of passivating a $Hg_{1-x}Cd_xTe$ substrate comprising the steps of:
    (a) providing a substrate of $Hg_{1-x}Cd_xTe$; and
    (b) anodically growing a selenide layer on said $Hg_{1-x}Cd_xTe$ substrate.

2. The method of claim 1, wherein:
    (a) said anodic growing is performed by providing an electrochemical bath having selenide ions therein.

3. The method of claim 2, wherein:
    (a) said bath includes ethylene glycol therein.

4. The method of claim 1, further comprising the step of:
    (a) cleaning a surface of said $Hg_{1-x}Cd_xTe$ substrate prior to said anodic growth at said cleaned surface.

5. A method of passivating $Hg_{1-x}Cd_xTe$ on a substrate comprising the steps of:
    (a) providing said $Hg_{1-x}Cd_xTe$ on a substrate,
    (b) cleaning a surface of said $Hg_{1-x}Cd_xTe$; and
    (c) anodically growing a selenide layer with components of said $Hg_{1-x}Cd_xTe$ at said cleaned surface.

6. The method of claim 5, wherein:
    (a) said anodic growing includes providing a selenide ion containing electrolyte solution, immersing said $Hg_{1-x}Cd_xTe$ in said electrolyte solution, and applying a voltage between said $Hg_{1-x}Cd_xTe$ and said solution.

7. The method of claim 6, wherein:
    (a) said voltage is applied to maintain the anodizing current density approximately constant.

8. The method of claim 7, wherein:

(a) said current density is about 100 microamperes per square centimeter.

9. The method of claim 7, wherein:

(a) said electrolyte solution includes a water soluble selenide and water.

10. The method of claim 7, wherein:

(a) said water soluble selenide is sodium selenide.

11. The method of claim 7, wherein:

(a) said electrolyte solution includes ethylene glycol.

* * * * *